United States Patent

Tsuji

[11] Patent Number: 6,118,710
[45] Date of Patent: Sep. 12, 2000

[54] SEMICONDUCTOR MEMORY DEVICE INCLUDING DISTURB REFRESH TEST CIRCUIT

[75] Inventor: Takaharu Tsuji, Hyogo, Japan

[73] Assignee: Mitsubishi Denki Kabushiki Kaisha, Tokyo, Japan

[21] Appl. No.: 09/195,038

[22] Filed: Nov. 19, 1998

[30] Foreign Application Priority Data

Jun. 8, 1998 [JP] Japan .................................. 10-159030

[51] Int. Cl.[7] ...................................................... G11C 7/00
[52] U.S. Cl. ............................ 365/200; 365/201; 365/222
[58] Field of Search ..................................... 365/200, 201, 365/222, 230.08

[56] References Cited

U.S. PATENT DOCUMENTS 5,381,371   1/1995   Haraguchi .............................. 365/201

FOREIGN PATENT DOCUMENTS 9-312100   12/1997   Japan .

OTHER PUBLICATIONS

"A Flexible Redundancy Technique for High–Density DRAM's", M. Horiguchi et al., IEEE Journal of Solid–State Circuits, vol. 26, No. 1, Jan. 1991, pp. 12–17.

*Primary Examiner*—Huan Hoang
*Attorney, Agent, or Firm*—McDermott, Will & Emery

[57] ABSTRACT

In a semiconductor memory device, replacement is possible with a redundant cell in the same or different memory sub array in a mode other than a particular test mode. A redundancy determining circuit inactivates a spare word line enable signal corresponding to a redundant cell when a disturb refresh acceleration mode test is designated. An SWL driver renders a spare word line non-selective in response to the spare word line enable signal. An NWL driver simultaneously activates a plurality of word lines (except a word line corresponding to a defective cell) in response to a word line enable signal output from the redundancy determining circuit.

6 Claims, 6 Drawing Sheets

SEMICONDUCTOR MEMORY DEVICE INCLUDING DISTURB REFRESH TEST CIRCUIT

BACKGROUND OF THE INVENTION

1. Field of the Invention

The present invention relates to a semiconductor memory device and more specifically to a configuration of a semiconductor memory device including replaceable redundant cells.

2. Description of the Background Art

An example of a conventional semiconductor memory device including redundant cells will be described briefly with reference to FIG. 5.

The conventional semiconductor memory device 9000 shown in FIG. 5 includes a register 901, a row address buffer 902, a redundancy determining circuit 511, a row predecoder 512, a memory cell array 510, a column decoder 903, and a data input/output buffer 904.

Register 901 receives external signals (such as an external row address strobe signal /RAS, an external column address strobe signal /CAS, an external chip select signal /CS, an external write enable signal /WE, an external clock signal CLK, and an external clock enable signal CKE) and outputs corresponding control signals.

In response to an act signal ACT received from register 901, row address buffer 902 outputs a row address signal in accordance with external address signals A0 to Ai.

Memory cell array 510 includes a plurality of memory sub arrays A(0), A(1), ..., A(n). The memory sub arrays include corresponding normal blocks (NBL(0), NBL(1), ..., NBL(n)) each formed of normal memory cells and corresponding redundant blocks (RBL(0), RBL(1), ..., RBL(n)) each formed of redundant cells. Each memory cell in the normal block is connected to a corresponding word line WL. Each redundant cell in the redundant block is connected to a corresponding spare word line SWL.

For a normal block in one memory sub array, replacement using a redundant cell in another memory sub array is allowed.

Redundancy determining circuit 511 determines use/non-use of a redundant cell, and outputs a spare word line enable signal RWLE for selecting spare word line SWL in the redundant block and a word line enable signal NWLE for selecting word line WL in the normal block.

When a redundant cell is to be used, corresponding spare word line enable signal RWLE is activated and corresponding word line enable signal NWLE is inactivated. When a redundant cell is not to be used, spare word line enable signal RWLE is inactivated and corresponding word line enable signal NWLE is activated.

In response to word line enable signal NWLE, row predecoder 512 outputs a decode signal for designating a corresponding word line in accordance with the output of row address buffer 902. Row predecoder 512 also outputs a block select signal for designating a corresponding sense amplifier block and a corresponding normal block in accordance with the output of row address buffer 902.

The conventional semiconductor memory device 9000 shown in FIG. 5 includes the configuration of a shared sense amplifier type. A sense amplifier block 2 is placed between adjacent memory sub arrays. The adjacent memory sub arrays share sense amplifier block 2.

An SA driver 924 and a word line driver 925 are placed for memory cell array 510. Word line driver 925 selects word line WL or spare word line SWL in accordance with the outputs of redundancy determining circuit 511 and row predecoder 512. SA driver 924 outputs a control signal SACnt for controlling activation/inactivation of each sense amplifier block 2.

In accordance with the control of column decoder 903, data input/output buffer 904 transmits and receives signals between data-on input/output pins DQ0 to DQn and memory cell array 510.

Thus, in the conventional semiconductor memory device 9000 shown in FIG. 5, the repair efficiency is enhanced and the occurrence of a defective product is prevented by adopting a configuration allowing replacement with a redundant cell in the same or different memory sub array.

There is the disturb refresh test as a test for semiconductor memory devices. The disturb refresh test repeats reading operation of a word line of interest (repeatedly turns on/off the word line) for a predetermined period to create a situation where leakage is easily caused in a memory cell in the vicinity of the word line of interest. In this manner, the storage state of the memory cell is tested.

Besides the disturb refresh test, there is the disturb refresh acceleration mode test that accelerates the disturb refresh test.

The disturb refresh acceleration mode test carries out a test in a shorter period by simultaneously activating a plurality of word lines.

When the disturb refresh acceleration mode test is performed in conventional semiconductor memory device 9000 above, however, a following problem occurs.

The problem with the disturb refresh acceleration mode test in conventional semiconductor memory device 9000 shown in FIG. 5 will be described with reference to FIG. 6.

Memory cell array 510 includes a plurality of memory sub arrays A(0), ..., A(n−2−1), A(n/2), ..., A(n−1), and A(n).

The memory sub arrays include corresponding normal memory blocks (NBL(0), ..., NBL(/2−1), NBL (n/2), ..., NBL(n−1), and NBL(n)) and corresponding redundant blocks (RBL(0), ..., RBL(n/2−1), RBL(n/2), ..., RBL(n)). Adjacent memory sub arrays share sense amplifier block 2.

It is assumed that a defect in normal block NBL(0) is repaired by spare word line SWL in the redundancy region of memory sub array A(n/2) as shown in FIG. 6.

When word line WL of memory sub array A(0) and word line WL of memory sub array A(n/2) are to be simultaneously activated by the disturb refresh acceleration mode test in this situation, word line WL and spare word line SWL that is for redundancy are simultaneously selected and a defect is caused in memory sub array A(n/2).

SUMMARY OF THE INVENTION

An object of the present invention is to provide a semiconductor memory device allowing a high-speed and accurate disturb test in the semiconductor memory device having a redundancy region.

Another object of the present invention is to provide a semiconductor memory device allowing a high-speed and accurate disturb test without limiting the repair efficiency.

A semiconductor memory device according to the present invention includes: a memory cell array including a plurality of memory sub arrays, the plurality of memory sub arrays each including a plurality of memory cells arranged in rows and columns, a plurality of word lines arranged corresponding to rows, and a plurality of bit lines arranged corresponding to columns, at least one memory sub array further including a redundant cell for replacing a memory cell in a plurality of memory sub arrays; a test mode detecting circuit for detecting designation of a particular test mode in response to a test mode designation signal; a determining circuit for determining use/non-use of redundancy in response to an address signal; a first control circuit for rendering a corresponding memory cell selective/non-selective in accordance with the address signal and in response to the determination result of the determining circuit; and a second control circuit for rendering a corresponding redundant cell selective/non-selective in accordance with the address signal and in response to the determination result of the determining circuit in a mode other than the particular test mode and for rendering a corresponding redundant cell non-selective regardless of the determination result of the determining circuit in the particular test mode.

A main advantage of the present invention is that, in a semiconductor memory device allowing replacement using a redundancy region in any memory sub array beyond one memory sub array, a test (disturb test) can be performed at high speed while preventing defective selection by simultaneously activating a plurality of word lines and inactivating a spare word line in a particular test mode.

Since replacement is possible even with a redundant cell in other memory sub arrays in a mode other than the particular test mode, a high efficiency of redundancy can be maintained without being limited by a test mechanism.

Especially, in the particular test mode, word lines (except a word line corresponding to a defective cell) in a plurality of memory sub arrays can simultaneously be activated by selecting the plurality of memory sub arrays. Thus, a high-speed and accurate disturb test can be performed.

Especially, a high-speed and accurate test can be performed in a disturb refresh acceleration mode test.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

A semiconductor memory device in a first embodiment of the present invention will be described. The semiconductor memory device in the first embodiment of the present invention provides a configuration for implementing a high-speed and accurate disturb test with a high repair efficiency.

The overall structure of the semiconductor memory device in the first embodiment of the present invention will be described with reference to FIG. 1.

Figure 1:
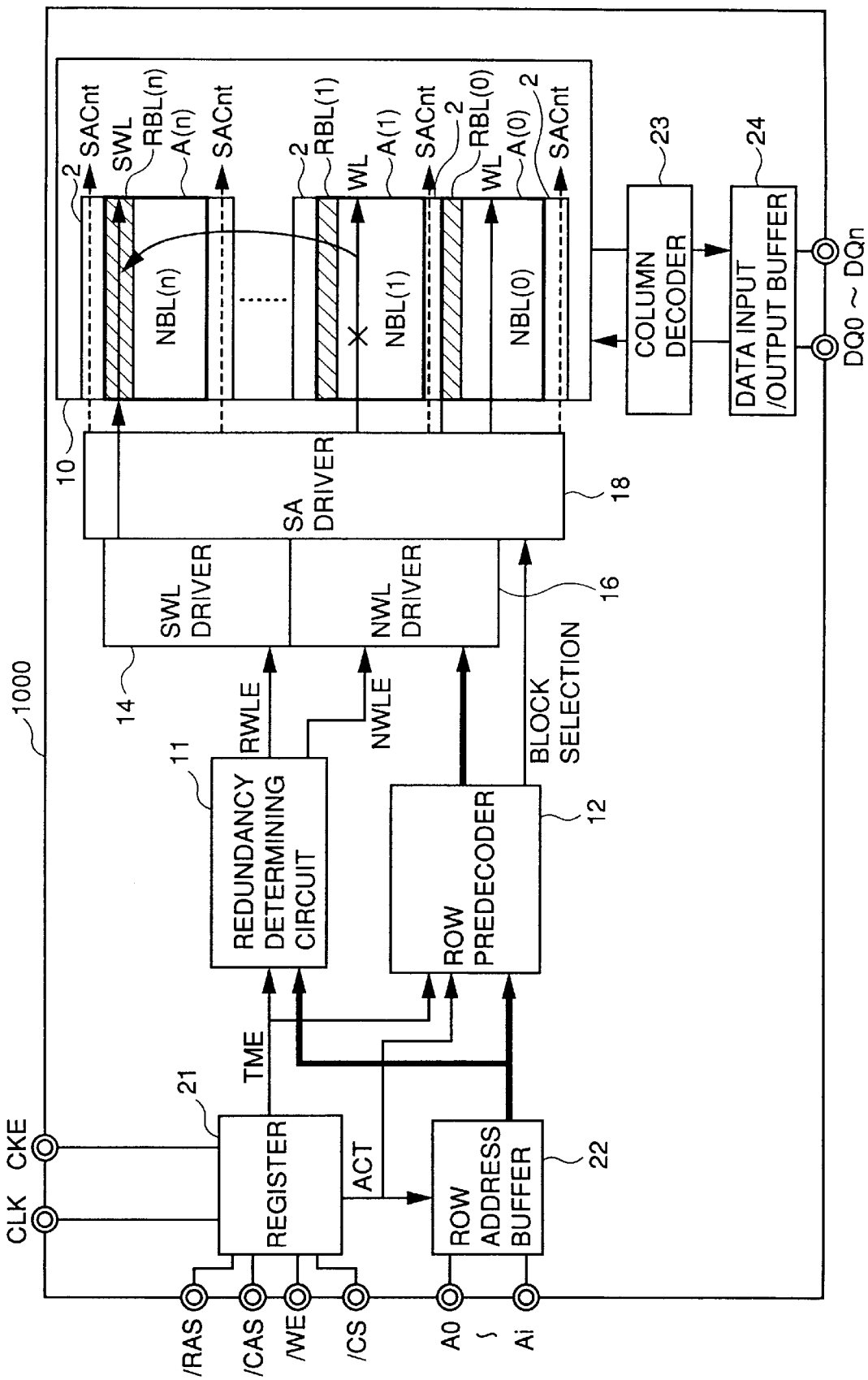
FIG. 1 is a schematic block diagram showing the overall structure of a semiconductor memory device 1000 in a first embodiment of the present invention.

The semiconductor memory device 1000 shown in FIG. 1 includes a register 21, a row address buffer 22, a redundancy determining circuit 11, a row predecoder 12, an SWL driver 14, an NWL driver 16, an SA driver 18, a memory cell array 10, a column decoder 23, and a data input/output buffer 24.

Register 21 receives external signals (such as an external row address strobe signal /RAS, an external column address strobe signal /CAS, an external chip select signal /CS, an external write enable signal /WE, an external clock signal CLK, an external clock enable signal CKE) and outputs corresponding control signals. In the first embodiment of the present invention, a test mode enable signal TME is output in response to a combination of received signals.

In response to an act signal ACT output from register 21, row address buffer 22 outputs a row address signal in accordance with external address signals A0 to Ai.

Memory cell array 10 includes a plurality of memory sub arrays A(0), A(1), ..., A(n). The memory sub arrays include corresponding normal blocks (NBL(0), NBL(1), ..., NBL(n)) each formed of normal memory cells and corresponding redundant blocks (RBL(0), RBL(1), ..., RBL(n)) each formed of redundant cells. Each memory cell in the normal block is connected to a corresponding word line WL. Each redundant cell in the redundant block is connected to a corresponding spare word line SWL.

In semiconductor memory device 1000, replacement is possible with a redundant cell existing in the same or different memory sub array.

Semiconductor memory device 1000 includes the configuration of a shared sense amplifier type. A sense amplifier block 2 is placed between adjacent memory sub arrays. Adjacent memory sub arrays share sense amplifier block 2.

SA driver 18 outputs a control signal SACnt for controlling activation/inactivation of each sense amplifier block 2.

In accordance with the control of column decoder 23, data input/output buffer 24 transmits and receives signals between date-on input/output pins DQ0 to DQn and memory cell array 10.

Redundancy determining circuit 11 outputs a word line enable signal NWLE and a spare word line enable signal RWLE described below in response to an X address signal output from row address buffer 22.

Redundancy determining circuit 11 also inactivates spare word line enable signal RWLE in response to test mode enable signal TME output from resistor 21. In the first embodiment of the present invention, test mode signal TME refers to a disturb refresh acceleration mode test.

SWL driver 14 selects spare word line SWL connected to a corresponding redundant cell in response to spare word line enable signal RWLE output from redundancy determining circuit 11.

NWL driver 16 selects word line WL in a corresponding normal block in response to word line enable signal NWLE output from redundancy determining circuit 11 and in accordance with the output of row predecoder 12.

The structure of redundancy determining circuit 11 in the first embodiment of the present invention will be described in the following with reference to FIG. 2.

Figure 2:
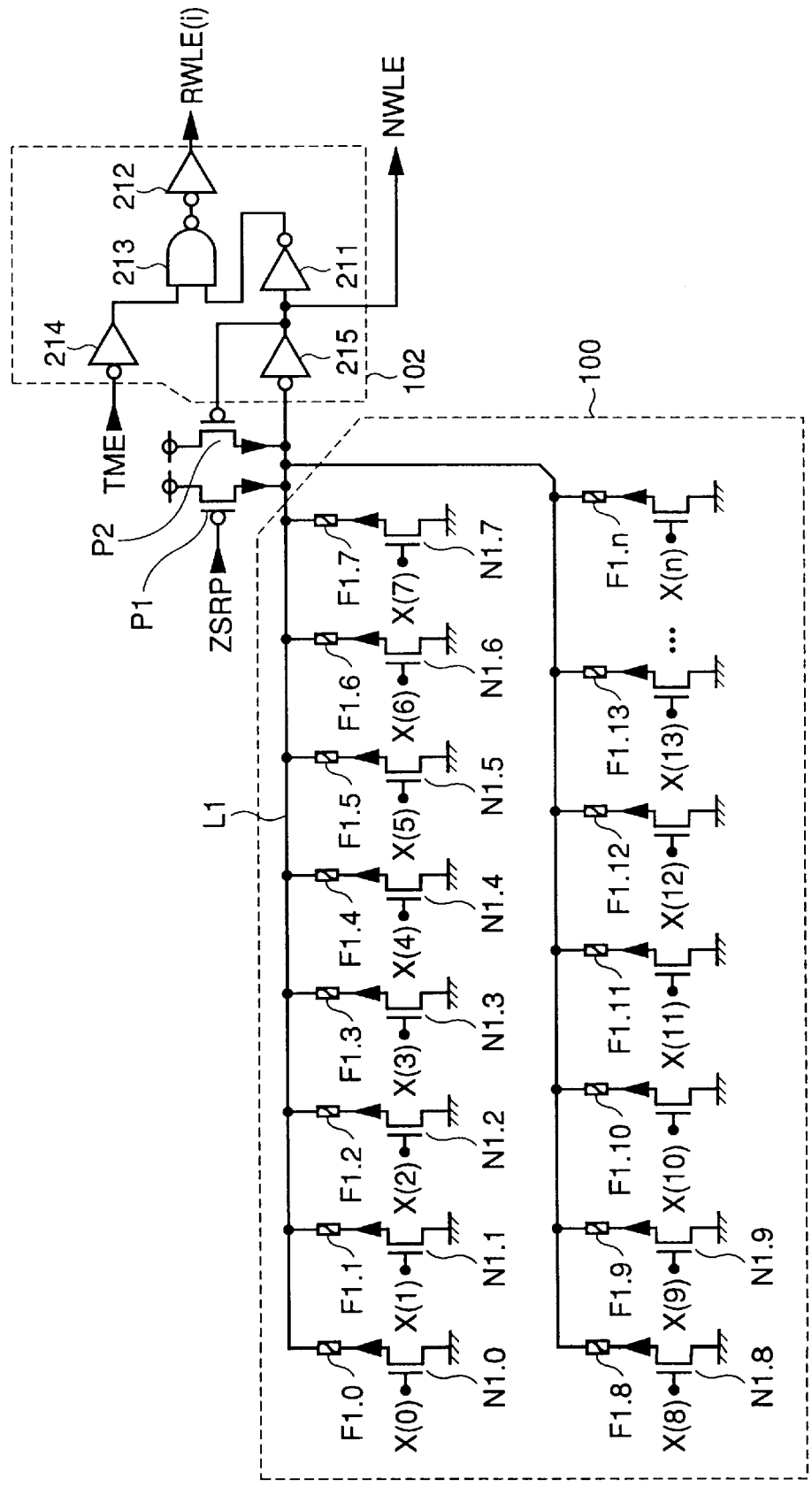
FIG. 2 is a circuit diagram showing one example of the structure of redundancy determining circuit 11 included in FIG. 1 semiconductor memory device 1000 in the first embodiment of the present invention.

FIG. 2 shows a structure corresponding to one redundant cell. A redundancy detecting circuit 100 and an enable signal generating circuit 102 are placed.

Redundancy detecting circuit 100 has an NMOS transistor and a fuse for each X address signal. In FIG. 2, NMOS transistors N1.1, N1.1, . . . , N1.n and fuses F1.0, F1.1, . . . , F1.n are placed for X address signals X(0), X(1), . . . , X(n). X address signals X(0), X(1), . . . , X(n) are input from row address buffer 22 shown in FIG. 1.

One conductive terminal of each of NMOS transistors N1.0, N1.1, . . . is connected between one terminal of each of corresponding fuses F1.0, F1.1, . . . , F1.n and a ground potential. The other terminal of each of fuses F1.0, F1.1, . . . , F1.n is connected to a signal line L1.

PMOS transistors P1 and P2 are placed between signal line L1 and a power supply potential. The gate electrode of PMOS transistor P1 receives a precharge signal ZSRP. The gate electrode of PMOS transistor P2 receives the output signal of an inverter circuit 215 described below. Thus, signal line L1 is charged to a precharge level (power supply potential level) in an initial state. The potential of signal line L1 is kept at a constant level by PMOS transistor P2.

Enable signal generating circuit 102 includes inverter circuits 211, 212, 214 and 215 and an NAND circuit 213. Inverter circuit 214 receives test mode enable signal TME. The input node of inverter circuit 215 is connected to signal line L1. Inverter circuit 215 outputs word line enable signal NWLE for controlling selection of a word line in a normal block.

Inverter circuit 211 inverts the output (word line enable signal NWLE) of inverter circuit 215. NAND circuit 213 receives the outputs of inverter circuits 214 and 211. Inverter circuit 212 inverts the output of NAND circuit 213 and outputs a corresponding spare word line enable signal RWLE (RWLE(i) in the figure).

A fuse in redundancy detecting circuit 100 is disconnected in advance corresponding to the address of a defective cell. As a result, when a defective cell is designated, word line enable signal NWLE is inactivated to an L level with respect to the input of corresponding X address signal.

When test mode enable signal TME is in an L level inactive state (a mode other than a particular test mode), spare word line enable signal RWLE is activated/inactivated in response to received X address signal.

On the contrary, when test mode enable signal TME is in an H level active state (the particular test mode), spare word line enable signal RWLE is always inactivated to the L level regardless of received X address signal.

The relations among row predecoder 12, NWL driver 16 and SWL driver 14 in the first embodiment of the present invention will be described in the following with reference to FIG. 3.

Figure 3:
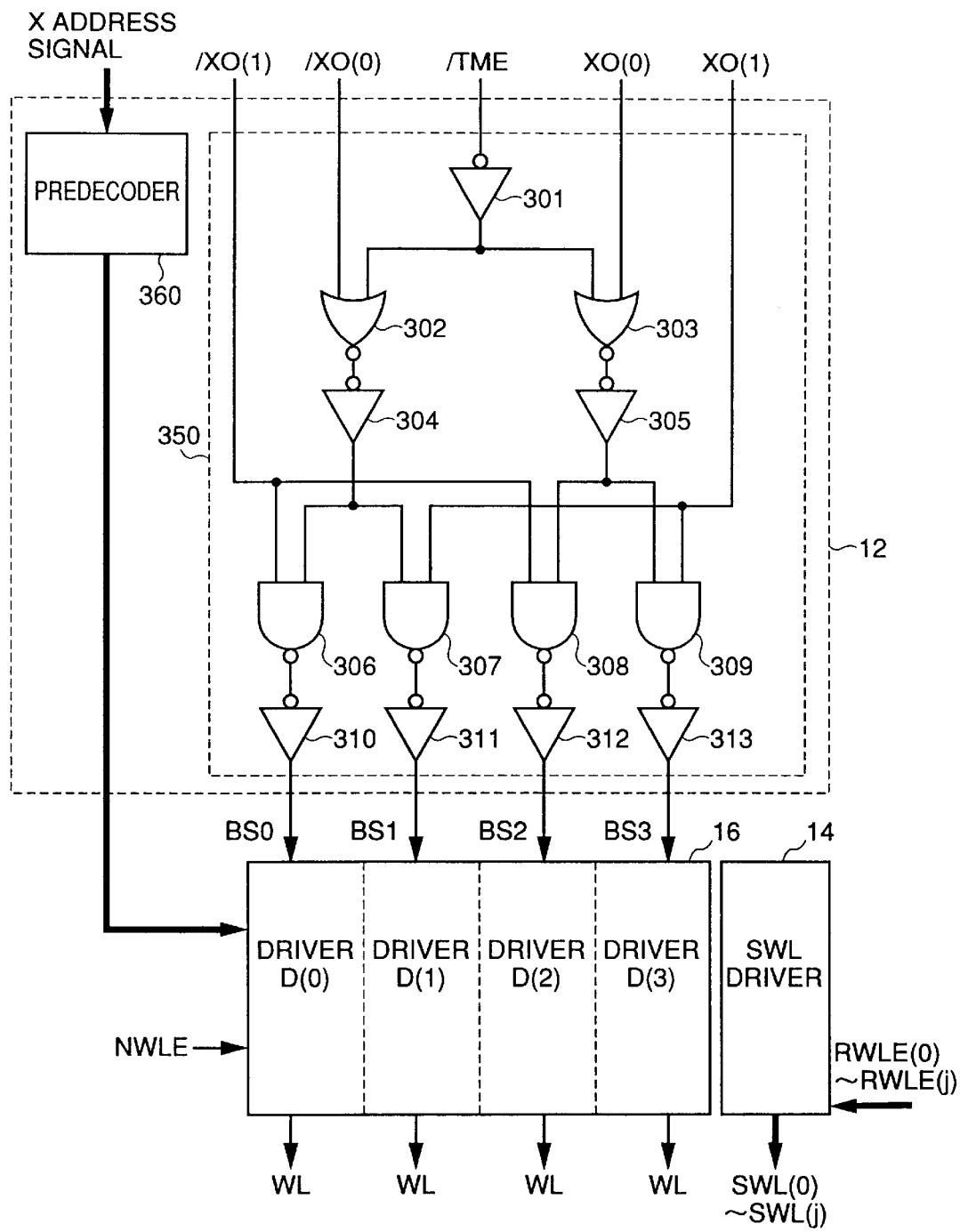
FIG. 3 shows one example of the structure of row predecoder 12, NWL driver 16, and SWL driver 14 in FIG. 1 semiconductor memory device 1000 in the first embodiment of the present invention.

FIG. 3 shows the structure of row predecoder 12, NWL driver 16 and SWL driver 14 of FIG. 1 semiconductor memory device 1000 in the first embodiment of the present invention. In the following, a structure corresponding to four memory sub arrays A(0) to A(3) (i.e. normal blocks NBL(0) to NBL(3)) will be described representatively.

Row predecoder 12 shown in FIG. 3 will be described. As shown in FIG. 3, row predecoder 12 includes a selecting circuit 350 for selecting a memory sub array and a predecoder 360.

Selecting circuit 350 includes inverter circuits 301, 304, 305, 310, 311, 312 and 313, NOR circuits 302 and 303, and NAND circuits 306, 307, 308 and 309.

Inverter circuit 301 receives an inversion test mode enable signal /TME that is inverted test mode enable signal TME and inverts and outputs it.

NOR circuit 302 and inverter circuit 304 are placed corresponding to normal blocks NBL(0) and NBL(1). NOR circuit 302 receives an inversion X address signal /X0(0) and the output of inverter circuit 301. Inverter circuit 304 inverts the output of NOR circuit 302.

NOR circuit 303 and inverter circuit 305 are placed corresponding to normal blocks NBL(2) and NBL(3). NOR circuit 303 receives an X address signal X0(0) and the output of inverter circuit 301. Inverter circuit 305 inverts the output of NOR circuit 303.

NAND circuit 306 and inverter circuit 310 are placed corresponding to normal block NBL(0). NAND circuit 307 and inverter circuit 311 are placed corresponding to normal block NBL(1).

NAND circuit 308 and inverter circuit 312 are placed corresponding to normal block NBL(2). NAND circuit 309 and inverter circuit 313 are placed corresponding to normal block NBL(3).

NAND circuit 306 receives an inversion X address signal /X0(1) and the output of inverter circuit 304. Inverter circuit 310 inverts the output signal of NAND circuit 306. Inverter circuit 310 outputs a block select signal BS0.

NAND circuit 307 receives an X address signal X0(1) and the output of inverter circuit 304. Inverter circuit 311 inverts the output signal of NAND circuit 307. Inverter circuit 311 outputs a block select signal BS1.

NAND circuit 308 receives inversion X address signal /X0(1) and the output of inverter circuit 305. Inverter circuit 312 inverts the output signal of NAND circuit 308. Inverter circuit 312 outputs a block select signal BS2.

NAND circuit 309 receives X address signal X0(1) and the output of inverter circuit 305. Inverter circuit 313 inverts the output signal of NAND circuit 309. Inverter circuit 313 outputs a block select signal BS3.

Block select signals BS0, BS1, BS2 and BS3 select normal blocks NBL(0), NBL(1), NBL(2) and NBL(3), respectively.

It is noted that X address signal X0(0), X address signal X0(1), inversion X address signal /X0(0) and inversion X address signal /X0(1) correspond to address signals of the more significant bits output from row address buffer 22 shown in FIG. 1.

The operation of selecting circuit 350 will be described. When test mode enable signal TME is in the H level active state (a particular test mode), NOR circuits 302 and 303 both receive an H level signal. Accordingly, inverter circuits 304 and 305 always output an H level signal. As a result, block select signals BS0, BS1, BS2 and BS3 are activated/inactivated in response to received X address signal X0(1) and inversion X address signal /X0(1).

More specifically, if X address signal X0(1) is at the H level (/X0(1) is at the L level), signals BS1 and BS3 are activated to the H level. Thus, normal blocks NBL(1) and NBL(3) are simultaneously selected.

When test mode enable signal TME is in the L level inactive state (a mode other than the particular test mode), inverter circuit 305 outputs an H level signal and inverter circuit 304 outputs an L level signal if X address signal X0(0) is in the H level state (inversion X address signal /X0(0) is in the L level state). As a result, one of block select signals BS2 and BS3 is activated and the other is inactivated in response to X address signal X0(1) or inversion X address signal /X0(1). Thus, one of normal blocks NBL(2) and NBL(3) is selected.

Predecoder 360 shown in FIG. 3 will be described. Predecoder 360 outputs a decode signal in accordance with a X address signal output from row address buffer 22. NWL driver 16 described below receives the decode signal.

NWL driver 16 shown in FIG. 3 will be described. NWL driver 16 includes drivers corresponding to respective normal blocks. FIG. 3 shows a driver D(0) corresponding to normal block NBL(0), a driver D(1) corresponding to normal block NBL(1), a driver D(2) corresponding to normal block NBL(2), and a driver D(3) corresponding to normal block NBL(3).

Drivers D(0), D(1), D(2) and D(3) each select word line WL in a corresponding normal block in response to word line enable signal NWLE and in accordance with a corresponding block select signal and decode signal. When the block select signal or word line enable signal NWLE is inactive, corresponding word line WL is not activated.

SWL driver 14 shown in FIG. 3 will be described. SWL driver 14 selects corresponding spare word line SWL (SWL (0) to SWL(j) in the figure) in response to spare word line enable signal RWLE (RWLE(0) to RWLE(j) in the figure) output from redundancy determining circuit 11. When spare word line enable signal RWLE is inactive, corresponding spare word line is not activated.

By this structure, spare word line enable signal RWLE is always at the L level in the disturb refresh acceleration mode test (when test mode signal TME is in the H level active state), and spare word line SWL corresponding to a redundant cell is thus not activated. On the other hand, a plurality of normal blocks are simultaneously selected in response to corresponding X address signals, and a plurality of word lines WL (except a word line corresponding to a defective cell) are simultaneously activated.

In a mode other than the disturb refresh acceleration mode test (when test mode enable signal TME is in the L level inactive state), corresponding spare word line enable signal RWLE is activated to the H level and word line enable signal NWLE is inactivated to the L level in response to determination of redundancy. As a result, a defective cell is replaced by a redundant cell.

More specifically, such a defect that word line WL and redundancy word line SWL included in the same memory sub array are simultaneously selected in the disturb refresh acceleration mode test can be prevented. In a normal mode, the repair efficiency can be enhanced.

In the first embodiment of the present invention, the redundant cells are placed dispersively in the memory sub arrays. However, the redundant cells may be concentrated in one memory sub array as shown in FIG. 4.

Figure 4:
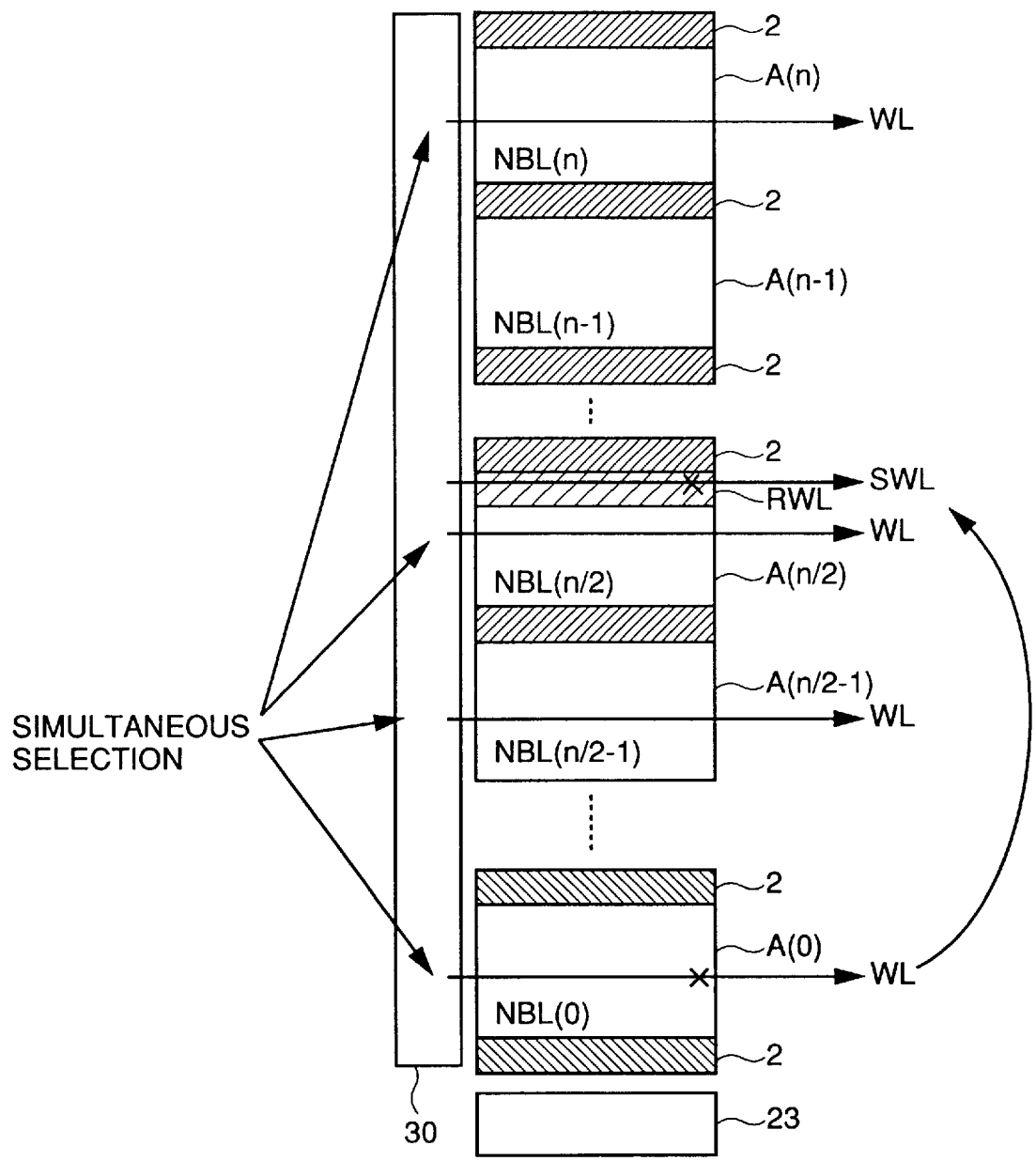
FIG. 4 shows another example of the structure of the memory cell array in the first embodiment of the present invention.
Figure 5:
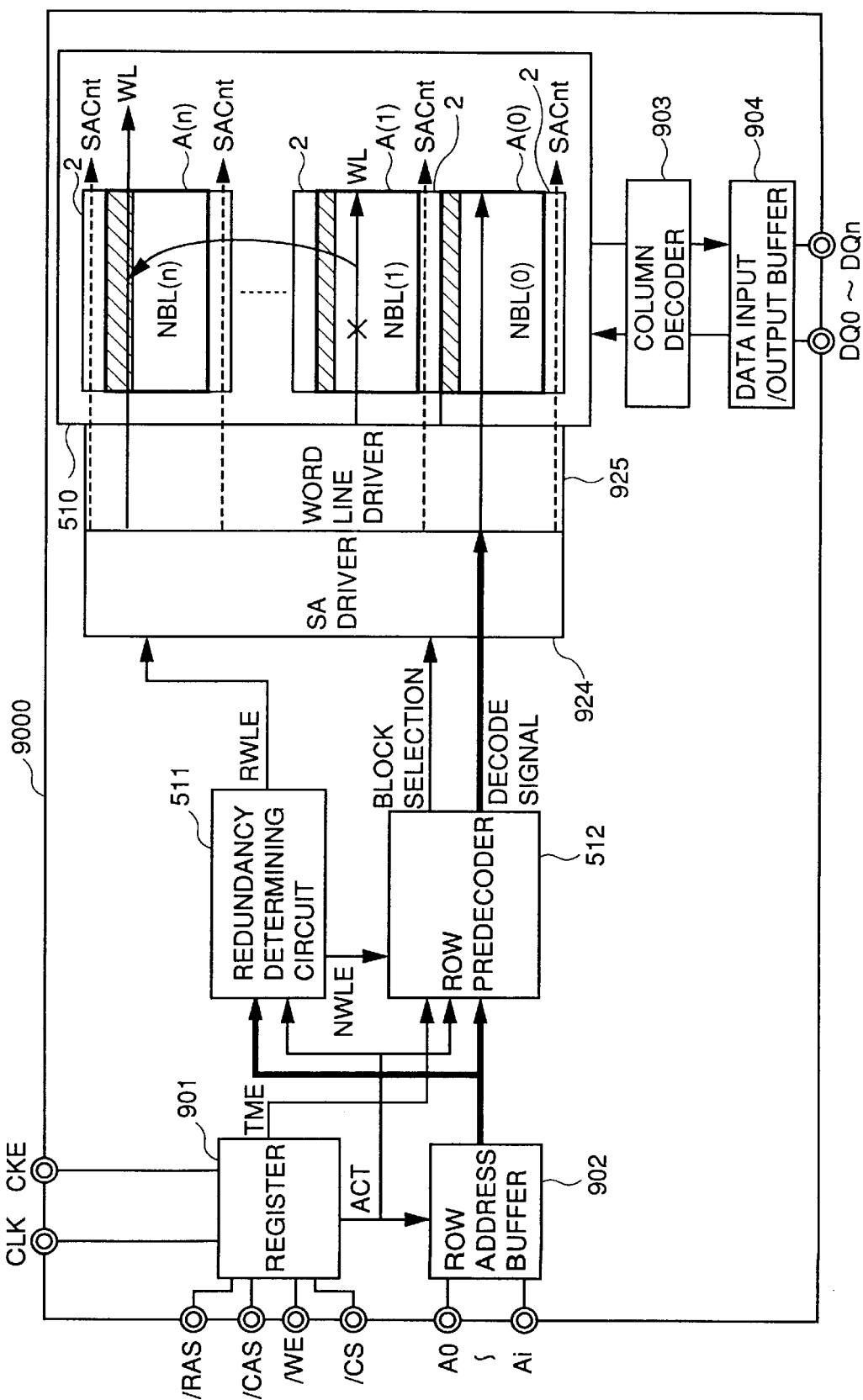
FIG. 5 is a schematic block diagram showing the overall structure of a conventional semiconductor memory device 9000.
Figure 6:
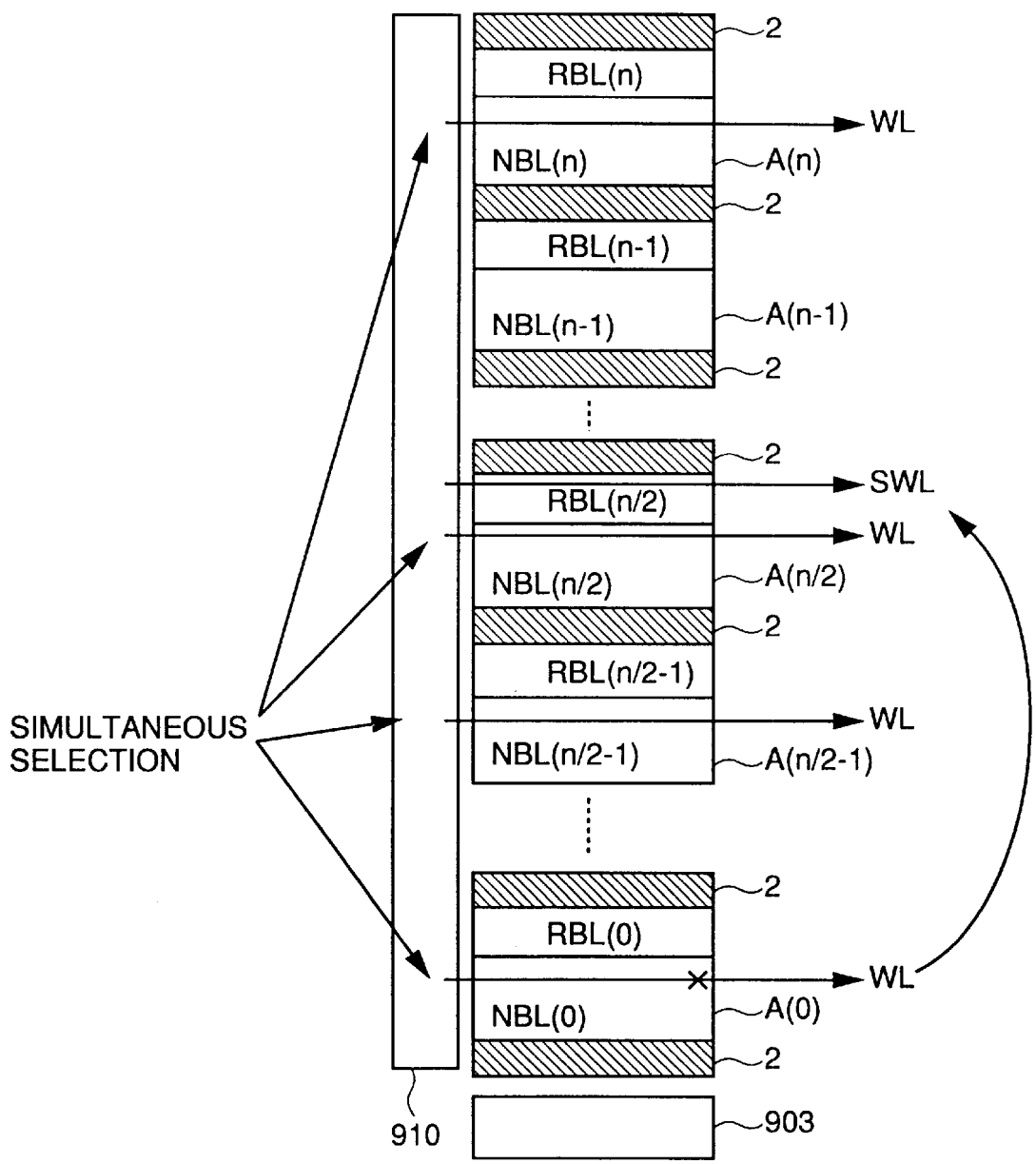
FIG. 6 is a diagram for illustrating a problem with a disturb refresh acceleration mode test in FIG. 5 conventional semiconductor memory device 9000.

FIG. 4 shows another example of the structure of the memory cell array in the first embodiment of the present invention. The memory cell array shown in FIG. 4 includes a plurality of memory sub arrays A(0), . . . , A(n/2), A(n/2−1), . . . , A(n). Adjacent memory sub arrays share sense amplifier block 2. The memory sub arrays include corresponding normal blocks NBL(0), . . . , NBL(n/2), NBL(n/2−1), . . . , NBL(n).

Memory sub array A(n/2) also includes redundant cells (symbol RWL). Other memory sub arrays do not include redundant cells. The redundant cells included in memory sub array A(n/2) are used to replace defective cells in all memory sub arrays.

Row decoder 30 (including a row predecoder and a driver) activates word line WL in a normal block or spare word line SWL corresponding to the redundant cell.

In the disturb refresh acceleration mode test, a plurality of word lines WL in a plurality of memory sub arrays are simultaneously selected. In this case, corresponding spare word line SWL is rendered non-selective along with word line WL corresponding to a defective cell even if the redundant cell is used. As a result, simultaneous selection of a word line and a spare word line in the same memory sub array (occurrence of defective selection) can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a plurality of memory sub arrays, said plurality of memory sub arrays each including a plurality of memory cells arranged in rows and columns, a plurality of word lines arranged corresponding to said rows, and a plurality of bit lines arranged corresponding to said columns, at least one said memory sub array further including a redundant cell for replacing said memory cell in said plurality of memory sub arrays;

test mode detecting means for detecting designation of a particular test mode in response to a test mode designation signal;

determining means for determining use/non-use of redundancy in response to an address signal;

first controlling means for rendering said memory cell selective/non-selective in accordance with said address signal and in response to the determination result of said determining means, and keeping the memory cell replaced by said redundant cell non-selective in said particular test mode; and second controlling means for rendering said redundant cell selective/non-selective in response to the determination result of said determining means and in accordance with said address signal in a mode other than said particular test mode, and for rendering said redundant cell non-selective regardless of the determination result of said determining means in said particular test mode.

2. The semiconductor memory device according to claim 1, wherein said redundant cell is connected to a spare word line, said test mode detecting means includes means for outputting a test mode signal in an active state in said particular test mode and for outputting said test mode signal in an inactive state in a mode other than said particular test mode, said first controlling means includes means for outputting a word line enable signal in an inactive state in response to the determination result of said determining means that said redundancy is to be used and for outputting said word line enable signal in an active state in response to the determination result of said determining means that said redundancy is not to be used, and first selecting means for selecting said word line in response to said word line enable signal, said second controlling means includes means for outputting a spare word line enable signal in an inactive state in response to said test mode signal in an active state and for outputting said spare word line enable signal in an active/inactive state in response to said test mode signal in an inactive state and the determination result of said determining means, and second selecting means for selecting said spare word line in response to spare word line enable signal.

3. The semiconductor memory device according to claim 2, further comprising
selecting means for selecting a memory sub array from said plurality of memory sub arrays in accordance with said test mode signal in an inactive state and said address signal and for selecting a plurality of memory sub arrays from said plurality of memory sub arrays in accordance with said test mode signal in an active state and said address signal; and
decode means for decoding said address signal, wherein said first selecting means includes a plurality of drivers corresponding to said plurality of memory sub arrays, and
said plurality of drivers each renders said word line in corresponding said memory sub array selective/non-selective in response to said word line enable signal and in accordance with the selection result of said selecting means and an output of said decode means.

4. The semiconductor memory device according to claim 1, wherein said particular test mode includes a disturb refresh test for simultaneously activating said word lines in a plurality of memory sub arrays among said plurality of memory sub arrays.

5. A semiconductor memory device comprising:
a normal memory cell block including a plurality of normal memory cells;
a redundant block including redundant cells substituted for defective memory cells among said plurality of normal memory cells;
a normal driver for selecting a normal memory cell among said plurality of normal memory cells;
a spare driver for selecting a redundant cell among said redundant cells; and
a redundant enable circuit for programming a defective address associated with the defective memory cell, enabling said spare driver to select the redundant cell when the programmed address matches an address indicated by an address signal in a normal mode, disabling said spare driver in a predetermined test mode, and disabling said normal driver when the programmed address matches the address indicated by the address signal in the normal and predetermined test modes.

6. The semiconductor memory device according to claim 5, further comprising a register for generating a test mode signal indicating the predetermined test mode, wherein
said redundant enable circuit includes a program circuit for programming the defective address and generating a match signal indicating that the programmed address matches the address indicated by the address signal; and
said redundant enable circuit disables said spare driver regardless of the match signal when the test mode signal indicates the predetermined test mode.

* * * * *